(12) United States Patent
Suzuki (10) Patent No.: US 6,797,634 B2
(45) Date of Patent: Sep. 28, 2004

(54) METHOD OF CONDITIONING AN ETCHING CHAMBER AND METHOD OF PROCESSING SEMICONDUCTOR SUBSTRATE USING THE ETCHING CHAMBER

(75) Inventor: Koji Suzuki, Mihama-ku (JP)

(73) Assignee: Kawasaki Microelectronics, Inc., Mihama-ku (JP)

( * ) Notice: Subject to any disclaimer, the term of this patent is extended or adjusted under 35 U.S.C. 154(b) by 0 days.

(21) Appl. No.: 10/126,670

(22) Filed: Apr. 22, 2002

(65) Prior Publication Data

US 2002/0155714 A1 Oct. 24, 2002

(30) Foreign Application Priority Data

Apr. 20, 2001 (JP) ........................................ 2001-122585

(51) Int. Cl.[7] ............................................ H01L 21/302
(52) U.S. Cl. ...................... 438/706; 438/714; 438/717; 438/719; 438/725
(58) Field of Search ................................. 438/706, 714, 438/719, 725, 717

(56) References Cited

U.S. PATENT DOCUMENTS

| | | | |
|---|---|---|---|
| 5,129,985 A | | 7/1992 | Nagashima et al. |
| 5,356,478 A | | 10/1994 | Chen et al. |
| 5,405,488 A | * | 4/1995 | Dimitrelis et al. ............ 216/60 |
| 5,647,953 A | | 7/1997 | Williams et al. |
| 5,756,400 A | | 5/1998 | Ye et al. |
| 5,824,375 A | | 10/1998 | Gupta |
| 6,040,248 A | * | 3/2000 | Chen et al. .................. 438/725 |
| 6,274,500 B1 | * | 8/2001 | Xuechun et al. ............ 438/706 |
| 6,322,716 B1 | | 11/2001 | Qiao et al. |
| 6,350,697 B1 | | 2/2002 | Richardson et al. |
| 6,537,906 B1 | * | 3/2003 | Mori .......................... 438/636 |

OTHER PUBLICATIONS

S. Tabara, Impact of Chamber History on Process Stability in the Gate Etching Employing $Cl_2-$ and HBr–based ECR Plasmas, 2001, Process International Symposium, pps. 123–128.

S. Xu et al., Characteristics and Mechanism of Etch Process Sensitivity to Chamber Surface Condition, 1999, Dry Process Symposium, pps. 191–196.

Facsimile letter from Electronic Device Manufacturing System group of Hitachi dated Jan. 30, 1997 with English translation.

* cited by examiner

Primary Examiner—Nadine G. Norton
Assistant Examiner—Binh X. Tran
(74) Attorney, Agent, or Firm—Oliff & Berridge, PLC (57) ABSTRACT

A method of conditioning an etching chamber and a method of processing semiconductor substrates are disclosed. The etching chamber used for etching a BARC layer and a polysilicon layer is conditioned by oxygen containing gas atmosphere. Thereafter, a plurality of substrates having the polysilicon layer and the BARC layer are successively processed within the etching chamber to form patterns with a reduced pattern size variation.

38 Claims, 6 Drawing Sheets

METHOD OF CONDITIONING AN ETCHING CHAMBER AND METHOD OF PROCESSING SEMICONDUCTOR SUBSTRATE USING THE ETCHING CHAMBER

BACKGROUND OF THE INVENTION

1. Field of Invention

This invention relates to a method of conditioning an etching chamber and a method of processing semiconductor substrates that form semiconductor devices, including the conditioning of the etching chamber. This invention is particularly advantageously utilized in etching of multi-layered structure comprising an organic bottom anti-reflective coating (BARC) and a conductive material layer in the same etching chamber.

2. Description of Related Art

Formation of fine patterns with high dimensional controllability and high selectivity is required to increase the density of semiconductor integrated circuits. The fine patterns are usually formed by selectively etching a material film over a surface of a semiconductor substrate (e.g., a wafer) using fine photo-resist patterns as a mask. Recently, deep UV (DUV) light such as KrF or ArF excimer laser light is used to form the resist patterns. In photolithography, using DUV light, a BARC layer functioning as an anti-reflection layer is widely used.

In a process using the BARC, a BARC layer is formed between the resist film and the material film to be etched. After the resist pattern is formed by photolithography, the BARC layer is patterned using the resist pattern as a mask. Plasma etching using an etching gas atmosphere containing oxygen as a primary etching species forms the BARC pattern. Then, the material layer is patterned using stacked mask of the resist and the BARC patterns.

When forming gate electrodes of transistors, the material film may be a polysilicon film on a thin gate dielectric film formed on a surface of the semiconductor substrate. A bulk of the polysilicon film may be etched using a chlorine-based etching gas atmosphere (main etching gas atmosphere), such as $Cl_2/HBr/O_2$ or $Cl_2/O_2$. After the bulk of the polysilicon film is etched, the polysilicon film is over-etched using another etching gas atmosphere (over-etching gas atmosphere) in order to remove residues of the polysilicon film. The over-etching is made by, for example, $HBr/O_2$. The over-etching gas atmosphere provides a high etching rate ratio (selectivity) over the underling gate dielectric film. Therefore, the residue of the polysilicon film can be removed without significantly etching the gate dielectric film.

In the etching for forming gate electrodes, a high-density plasma etching apparatus, such as ECR (Electron Cyclotron Resonance) plasma etching apparatus or ICP (Inductive Coupled Plasma) etching apparatus, is used. Usually, a plurality of wafers that forms a lot, which are housed in one or more cassettes, are transferred to an etching apparatus. Each of the wafers housed in the cassette is processed one by one by the etching apparatus with a same condition.

When the plurality of wafers is successively processed, by-products formed during the etching are deposited and accumulated on the inner wall of an etching chamber of the apparatus. The accumulation of the by-product forms particles that cause pattern defects. The accumulated by-product releases gasses to the etching gas atmosphere that disturb the etching process. Therefore, the accumulated by-product is removed by plasma cleaning. The etching chamber is subjected to the plasma cleaning after processing, for example, all the wafers in a lot, all the wafers housed in a cassette, or a certain number of wafers.

A fluorine-based gas, such as $SF_6$ or $NF_3$, is used for the plasma cleaning. After the plasma cleaning, fluorine-containing species remains in the etching chamber. The residual fluorine-containing species release fluorine into the etching gas atmosphere used for etching polysilicon layer. The fluorine released into the etching gas atmosphere decreases the selectivity to the underlying gate dielectric layer.

A dummy etching is conducted using a dummy wafer and a dummy etching gas atmosphere having a composition similar to, or the same as, the main etching gas atmosphere used for etching the polysilicon layer, e.g., $Cl_2/HBr/O_2$. The residual fluorine content in the etching chamber is reduced. After these pretreatment steps, the first wafer is processed.

In the actual process, the top BARC film is etched with an oxygen-based etching gas atmosphere, such as $Cl_2/O_2$ or $Cl_2/O_2/Ar$. A bulk of the polysilicon layer is etched using a chlorine-based etching gas atmosphere, such as $Cl_2/HBr/O_2$. The polysilicon layer is over-etched to remove residue of the polysilicon using another etching gas atmosphere containing oxygen, such as $HBr/O_2$. In the etching of the BARC layer and the polysilicon layer, optical emission from the plasma is monitored to automatically detect the completion, that is, the end point, of the etching.

Thus, according to related etching methods, after a cleaning using a fluorine-containing gas atmosphere, and a dummy etching using a $Cl_2/HBr/O_2$ gas atmosphere, a plurality of wafers having the BARC layer is successively etched.

However, this inventor has found as a result of various experiments and studies that according to this related method, the size of the etched pattern changes during the successive processing of the wafers. That is, the size in the first wafer is the largest among those of the processed wafers and the sizes in the subsequently processed wafers gradually decrease and reach to a substantially constant value. Thus, a first problem is that the pattern size varies in the short term. Secondly, the inventor has also found that as the pattern size tends to gradually increase according to the number of processed wafers, long-term variation of the pattern size also becomes a problem.

SUMMARY OF THE INVENTION

Accordingly, it is a first object of this invention to provide a method for preventing the pattern size variation in the short term.

Methods of conditioning an etching chamber for processing a semiconductor substrate, and methods of processing a plurality of semiconductor substrates for forming semiconductor devices are performed in accordance with the first object of this invention. The substrate comprises: a conductive material layer on a surface of the substrate; a BARC layer stacked over the conductive material layer; and a mask pattern formed over the BARC layer.

According to an aspect of this invention, the processing of the semiconductor substrate comprises: etching the BARC layer using a first etching gas atmosphere containing oxygen; and etching the conductive material layer using a second etching gas atmosphere. The method of conditioning, before processing the semiconductor substrate, comprises: conducting a dummy run in the etching chamber using a dummy run gas atmosphere containing at least one of chlorine and bromine; and conditioning the etching chamber after conducting the dummy run using a conditioning gas atmosphere containing oxygen.

According to another aspect of this invention, the method of conditioning, before processing the semiconductor substrate, comprises: conducting a dummy run in the etching chamber using a dummy run gas atmosphere to increase an effective amount of oxygen radical scavenging species in the etching chamber; and conditioning the etching chamber after conducting the dummy run using a conditioning gas atmosphere to adjust the effective amount of oxygen radical scavenging species in the etching chamber.

According to another aspect of this invention, the method of a plurality of semiconductor substrates for forming semiconductor devices comprises: a. introducing one of the plurality of semiconductor substrates in an etching chamber; b. etching the organic material layer using a first etching atmosphere containing oxygen; c. etching the conducting material layer using a second etching gas atmosphere; and repeating steps a through c until all of the plurality of semiconductor substrates are processed. The method of processing further comprises a method of conditioning, before processing the plurality of semiconductor substrates, comprising: conducting a dummy run in the etching chamber using a dummy run gas atmosphere containing at least one of chlorine and bromine; and conditioning the etching chamber after conducting the dummy run using a conditioning gas atmosphere containing oxygen.

According to another aspect of this invention, the method of processing a plurality of semiconductor substrates for forming semiconductor devices comprises: a. introducing one of the plurality of semiconductor substrates in an etching chamber; b. etching the organic material layer using a first etching gas atmosphere containing oxygen; c. etching the conductive material layer using a second etching gas atmosphere; and d. repeating steps a through c until all of the plurality of semiconductor substrates are processed. The method of processing further comprises a method of conditioning, before processing the plurality of semiconductor substrates, comprises: conditioning the etching chamber such that an effective amount of oxygen radical scavenging species in the etching chamber just before starting the etching of the organic material layer of a first one of the plurality of semiconductor substrates is substantially equal to that just before starting the etching of the organic material layer of a second one of the plurality of semiconductor substrates.

According to still another aspect of this invention, the method of processing a plurality of semiconductor substrates for forming semiconductor devices comprises: a. introducing one of the plurality of semiconductor substrates in an etching chamber; b. forming a pattern of the organic material layer using a first etching gas atmosphere; c. forming a pattern of the conductive material layer; and d. repeating steps a through c until all of the plurality of semiconductor substrates are processed. The method of processing further comprises a method of conditioning, before processing the plurality of semiconductor substrates, that comprises: conducting a dummy run in the etching chamber using a dummy run gas atmosphere containing at least one of chlorine and bromine; and conditioning the etching chamber after conducting the dummy run using a conditioning gas atmosphere. The mask pattern of the semiconductor substrates has a mask size; and the pattern of the conductive material layer of the semiconductor substrate has a pattern size. Each of the plurality of semiconductor substrate has a pattern shift between the mask size and the pattern size; and the conditioning is performed such that a variation of the pattern shift in the plurality of semiconductor substrates is substantially decreased compared to a case that the conditioning is not performed.

A second object of this invention to provide a method for preventing the pattern size variation in the long-term.

A method of processing a semiconductor substrate for forming a semiconductor device is also performed in accordance with the second object of this invention. The substrate comprises: a conducting material layer containing silicon on a surface of the substrate; and an organic material layer stacked on the conductive material layer. The method comprises: introducing a semiconductor substrate into an etching chamber; and etching the organic material layer by generating plasma in the etching chamber using an etching gas atmosphere containing oxygen. The etching includes detecting an end-point by monitoring an optical emission from CO molecules in the plasma separately from optical emissions from silicon compounds in the plasma.

DETAILED DESCRIPTION OF THE EXEMPLARY EMBODIMENTS

This invention was first described in Japanese Patent Application 2001-122585 filed on Apr. 20, 2001, hereby incorporated by reference in its entirety.

A method of conditioning an etching chamber and a method of processing semiconductor substrates according to embodiments of this invention will now be described in detail with reference to exemplary embodiments shown in the accompanying drawings.

Figure 1:
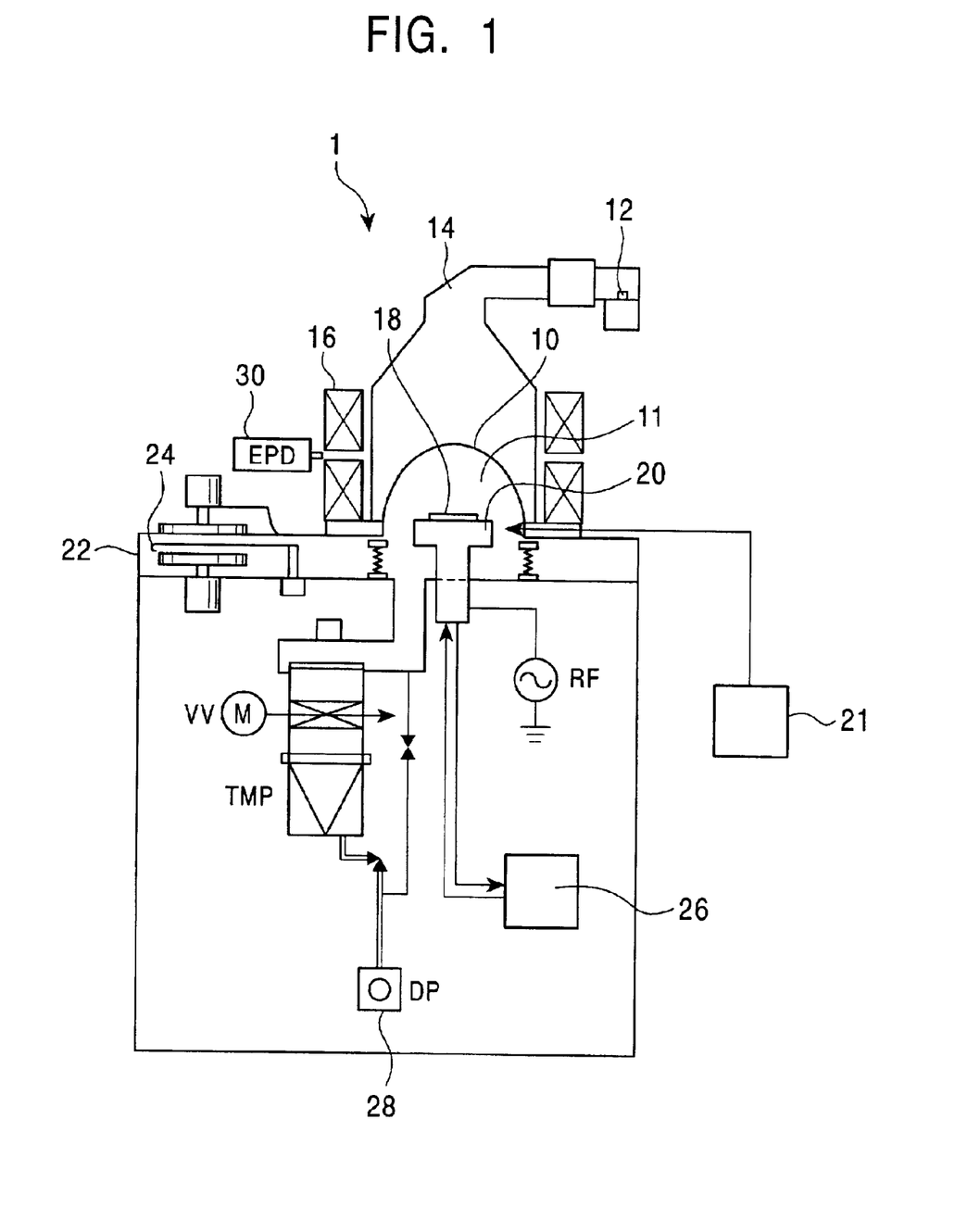
FIG. 1 is a schematic view showing the configuration of a plasma etching apparatus used in an embodiment of this invention.

FIG. 1 shows a schematic configuration of a plasma etching apparatus used in an embodiment of this invention.

In FIG. 1, a plasma etching apparatus 1 has an etching chamber 11. The upper half of the etching chamber is covered by a quartz discharge tube 10.

A process gas supply system 21 is provided to supply various etching gas compositions with desired flow rates into the etching chamber 11. A turbo molecular pump (TMP) backed with a dray pump 28 evacuates the etching chamber 11 through a motorized variable conductance valve (VV). Controlling the flow rate of the etching gas composition supplied into the chamber and the conductance of the variable conductance valve controls the pressure within the etching chamber to a desired value. Thereby, the pressure and the composition of the etching gas atmosphere within the etching chamber 11 are controlled.

A wafer holder 20 is provided in the etching chamber 11. A semiconductor substrate (or wafer) 18 to be processed is placed on the wafer holder 20. A radio frequency (RF) wave is supplied to the wafer holder 20. The circulator 26 circulates coolant having a temperature of −50 to 50° C. within the wafer holder 20 to control the temperature of the wafer holder 20. Helium gas having a high thermal conductivity is supplied through a cooling gas supply channel (not shown) within the wafer holder 20 to the back surface of the wafer 18. Thereby, the temperature of the wafer 18 is controlled.

A magnetic field is supplied to the etching gas atmosphere within the etching chamber 11 by a solenoid coil 16. Simultaneously, microwaves generated by a magnetron 12 are supplied to the quartz discharge tube 10 through a waveguide 14. A plasma (not shown) is generated within the chamber 11 by the interaction of the microwaves and the magnetic field. Thereby, various excited species comprising radicals and ions are generated within the etching chamber 11.

In addition, a bias voltage is generated and applied to the wafer 18 by supplying the RF wave to the wafer holder 20. The bias voltage controls the energy of ions that bombard onto the surface of the wafer 18. Thereby, various films on the surface of the wafer 18 are etched with the radicals and ions generated in the plasma.

Excited species in the plasma radiate optical emissions at specific wavelengths. The end point detector 30 provided in the vicinity of a side of the quartz discharge tube 10 monitors optical emissions at selected wavelengths and detects the end point of the etching.

The plasma etching apparatus 1 has a load-lock chamber (input load-lock chamber) 22, and a wafer-transfer arm 24. The wafer to be processed is loaded and temporarily stored in the load-lock chamber 22. The wafer-transfer arm 24 transfers the wafer from the load-lock chamber 22 to the wafer holder 20 in the etching chamber 11, and transfers back from the wafer holder 20 to an output load-lock chamber (not shown).

The plasma etching apparatus also has a cassette loading station (not shown) to receive cassettes that hold a plurality of wafers to be processed, and a robot (not shown) to transfer wafers in the cassettes into the input load-lock chamber 22. The robot also transfers processed wafers from the output load-lock chamber to the cassettes. Such structures not shown in FIG. 1 are shown in FIG. 4 of co-pending application Ser. No. 09/714,941, which is hereby incorporated by reference in its entirety.

In the plasma etching apparatus 1, wafers are processed by the following procedure.

First, the etching apparatus 1 receives a group, or a lot of wafers to be processed, housed in one or more cassettes. The cassettes are placed on the loading station. Each of the wafers has a single or multi-layered film that is to be etched over the surface of the wafer. The wafer also has a mask pattern used to selectively etch unmasked portions of the film.

A first one of the wafers is transferred into the input load-lock chamber 22, and is transferred onto the substrate holder 20. An etching gas atmosphere is supplied from the process gas supply system 21 into the etching chamber 11. Supplying microwaves and a magnetic field generates plasma in the etching chamber 11. Also, an RF wave is supplied to the substrate holder 20 to generate a bias voltage. Thereby, the surface of the wafer 18 is processed or etched.

As described above, the end point detector 30 monitors optical emission at a specific wavelength in order to detect the end point of the etching.

After the completion of the etching of the first wafer 18, the etched wafer is transferred back to the cassette through the output load-lock chamber and a second wafer is transferred onto the wafer holder 20, and etched. Then, the second wafer is transferred back to the cassette. These procedures are repeated until all of the wafers in the cassettes are processed.

The etching of each wafer may be performed with multiple steps. For example, as previously explained, when the wafer has a polysilicon layer as a film to be etched and also has a BARC layer, the BARC and the polysilicon layer are etched with separate steps using different gas atmospheres. Further, the polysilicon layer may be etched with a main etching and an over-etching step.

As previously explained, some treatments may be performed before processing the wafers. For example, plasma cleaning of the inner surface of the etching chamber 11 may be made using a fluorine-based gas. Then, a dummy run is conducted using a dummy run gas atmosphere having a composition similar to, or the same as, that used for etching the film to be etched. For example, when the film to be etched is a polysilicon film, $Cl_2/HBr/O_2$ gas atmosphere may be used in the main etching. Therefore, $Cl_2/HBr/O_2$ gas atmosphere with the same or modified gas mixing ratios may be used as the dummy run gas atmosphere.

During the plasma cleaning and the dummy run, a bare silicon wafer is transferred and placed on the wafer holder 20 as a dummy wafer to prevent damaging the upper surface of the wafer holder 20. Dummies wafer cassette in the cassette loading station holds the dummy wafer.

The plasma cleaning and the dummy run may be performed each time the etching apparatus receives a lot of wafers. The plasma cleaning and the dummy run may be performed after a predetermined number of lots of wafers are processed. Alternatively, the plasma cleaning and the dummy run may be performed after a predetermined number of wafers are processed.

As a result of various experiments and studies, this inventor found that when a plurality of wafers are successively processed after the plasma cleaning and the dummy run, the width of etched pattern changes between the wafers. The cause of the changes in the width is due to the change of the condition of the inner wall of the etching chamber 11. That is, the cause of the wider pattern width in the first wafer is considered to be the supply of an excessive amount of chlorine radicals to the BARC etching plasma from the inner wall of the etching chamber 11.

During the dummy run using a chlorine-containing gas atmosphere such as $Cl_2/HBr/O_2$, deposits containing chlorine compounds, such as $SiCl_x$ (x=1–4), adhere to the inner wall of the etching chamber 11. Such deposits release chlorine radicals to the plasma used to etch the BARC layer. Oxygen radicals are captured, or scavenged, by the chlorine radicals during the BARC etching as follows: Cl+O−ClO, and the oxygen radical concentration in the plasma decreases. That is, the chlorine compound in the deposits acts as oxygen radical scavenging species.

Due to the decrease of the oxygen radical concentration, which is the main etchant species, the etching rate of BARC in the lateral direction decreases. As a result, the width of BARC pattern becomes large, and the width of the polysilicon pattern etched using resist/BARC stacked pattern as a mask increases. Therefore, the critical dimension (CD) loss (i.e., the decrease of the dimension of the etched polysilicon pattern relative to the dimension of the resist pattern) is suppressed.

The amount of chlorine released from the inner wall is particularly large during the etching of the first wafer after the dummy etching. Therefore, the pattern width of the first wafer is particularly large. An excessive amount of the oxygen radical scavenging species within the etching chamber 11 increases the dimension of the etched pattern in the first wafer.

The amount of chlorine compound in the deposits and the amount of released chlorine decreases during the successive processing of wafers. Particularly, the amount of chlorine compound rapidly decreases during the BARC etching using an oxygen-based etching atmosphere.

Therefore, the amount of released chlorine radicals during the BARC etching for the second and the subsequent wafers is smaller than those during the BARC etching for the first wafer. Therefore, the pattern width becomes smaller in the second and the subsequent wafers.

After the processing of a certain number of wafers after the dummy run, the amount of released chlorine radicals becomes substantially constant. As a result, the pattern width also becomes substantially constant.

In order to prevent the change in the pattern width, a conditioning procedure is performed. The conditioning procedure is a plasma treatment to the inner wall of the etching chamber 11 performed after the dummy etching using a conditioning gas atmosphere containing oxygen.

During the conditioning, the chlorine compound in the deposits is removed or oxidized, by a reaction such as, $SiCl_x+O \rightarrow SiCl_{x-2}O+Cl_2$. Therefore, an effective amount of the oxygen radical scavenging species, i.e., the amount and composition of the chlorine compound that determines the amount of chorine radicals released into the plasma decreases.

By adjusting the condition of the conditioning treatment, the effective amount of the oxygen radical scavenging species within the etching chamber can be adjusted to a value substantially equal to that after the processing of a sufficient number of wafers. After the adjustment of the effective amount of the oxygen radical scavenging species, the wafer is processed. Thereby, the dimension of the pattern is substantially constant from the first wafer.

Chlorine radicals that scavenge oxygen radicals are formed by the decomposition of gaseous chlorine or other chlorine compounds in the plasma. The gaseous chlorine or other chlorine compounds are released from the chlorine compounds, such as $SiCl_x$, contained in the deposits on the inner wall of the etching chamber 11. The amount of chlorine released into the plasma increases when the amount of chlorine compound in the deposits increases.

However, the chemical state of the chlorine compound in the deposits is not uniform. Further, the amount of the chlorine released in the plasma changes according to the position of the deposits. That is, the amount of chlorine radical or other active species that scavenge oxygen radicals in the BARC etching plasma is determined according to not only the amount of the oxygen radical scavenging species, such as $SiCl_x$ and the like contained in the deposits on the inner wall of the etching chamber 11, but also according to the chemical state and position of the oxygen plasma scavenging species. It is accordingly necessary to control the effective amount of the oxygen radical scavenging species in the etching chamber 11 that determines the amount of chlorine radical or other active species that scavenge oxygen radicals in the BARC etching plasma.

Example 1 according to an exemplary embodiment of this invention and Comparative Examples 1 according to a related method will now be described.

A. EXAMPLE 1 AND COMPARATIVE EXAMPLE 1

In Example 1 and Comparative Example 1, 0.25 μm gate electrode etching was performed using the plasma etching apparatus 1 shown FIG. 1. Each of substrates used in Example 1 and Comparative Example 1 has a BARC (80 nm)/polysilicon (220 nm)/gate oxide (5 nm) structure and a resist pattern having a pattern size of 0.25 μm on the multi-layered film. According to the following sequence, 25 substrates were successively processed and the pattern shifts (i.e., the pattern size after etching minus the size before etching) were evaluated.

In Comparative Example 1, the following experiment is performed.

Step 1:

$SF_6$ cleaning of the etching chamber is performed using a dummy wafer under the following conditions:

microwave power=1000 W;

bias RF power=0 W;

$SF_6$ flow rate=100 sccm;

pressure=1.0 Pa; and time=5 minutes.

Step 2:

A $Cl_2/HBr/O_2$ dummy run is performed using a dummy wafer under the following conditions:

microwave power=500 W;

bias RF power=30 W;

$Cl_2/HBr/O_2$ flow rates=80/20/4 sccm;

pressure=0.5 Pa; and time=1 minute.

Step 3:

BARC etching of the first wafer is performed under the following conditions:

microwave power=500 W;

bias RF power=20 W;

$Cl_2/HBr/O_2/Ar$ flow rates=30/15/20/80 sccm;

pressure=0.4 Pa; and time=20% over-etching of EPD.

Step 4:

Polysilicon etching of the first wafer is performed under the following conditions:

microwave power=500 W;

bias power=30 W;

$Cl_2/HBr/O_2$ flow rates=80/20/4 seem;

pressure=0.5 Pa; and time=EPD.

Step 5:

Over-etching of the first wafer is performed under the following conditions:

microwave power=500 W;

bias power=20 W;

$HBr/O_2$ flow rates=100/5 sccm;

pressure=1.0 Pa; and time=0.5 minute.

Steps 3 through 5 were repeated for the remaining wafers.

Figure 2A:
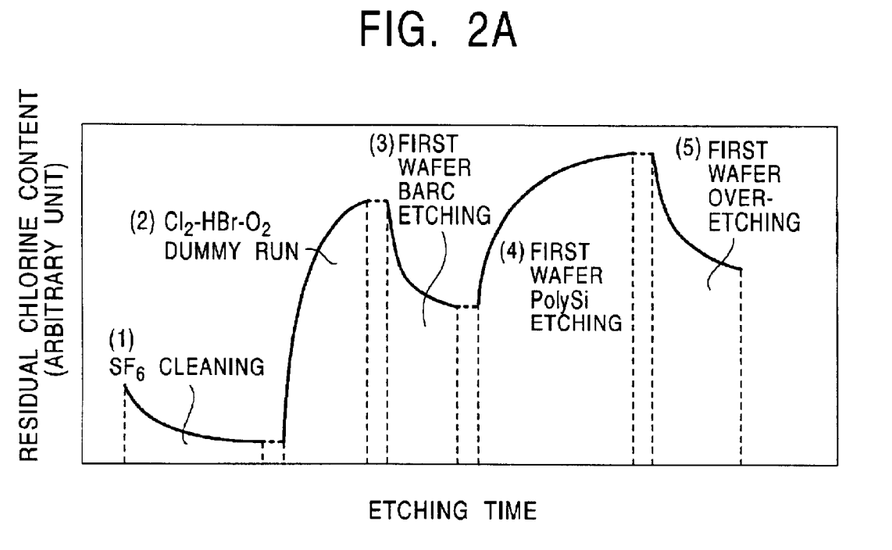
FIGS. 2A, 2B, and 2C are graphs showing changes in residual chlorine content in an etching chamber during successive processing of a plurality of semiconductor substrates in a related etching method.
Figure 2B:
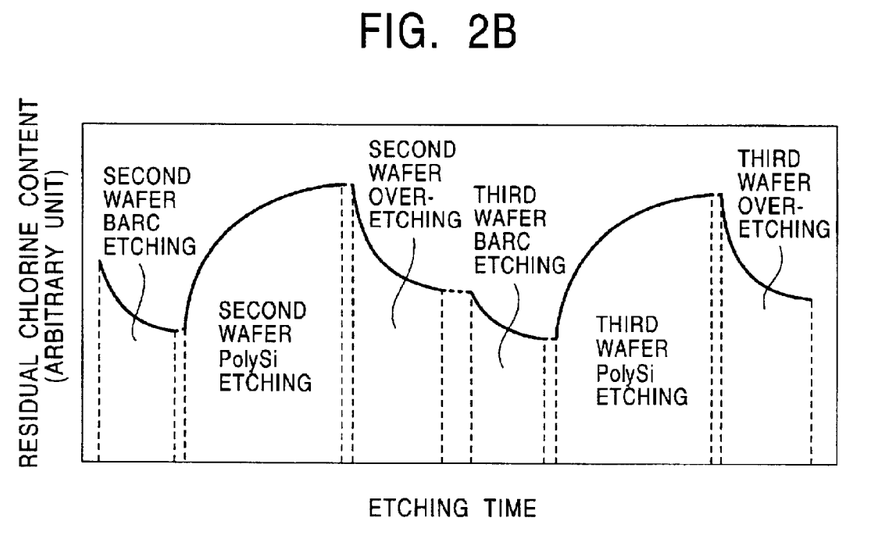
Figure 2C:
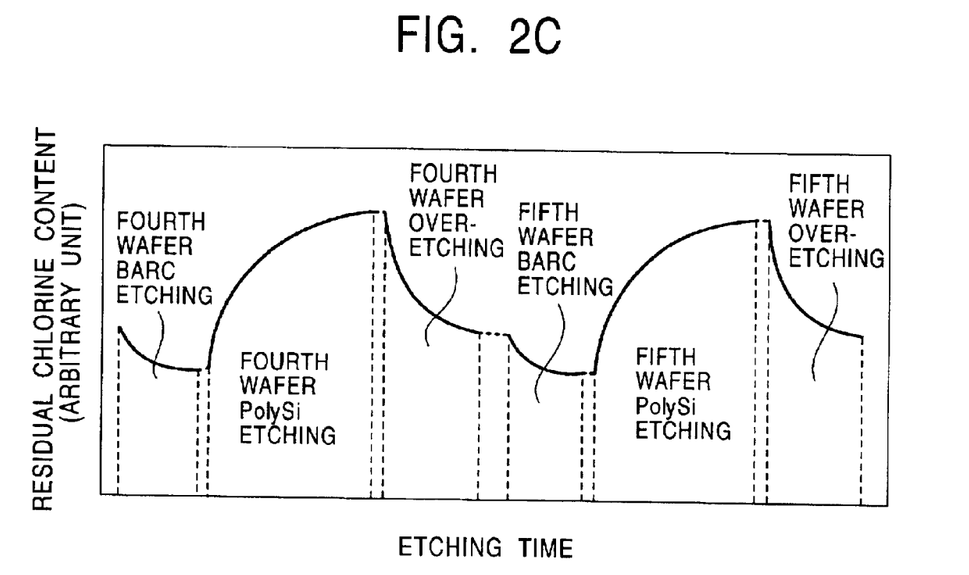

The change of residual chlorine content in the etching chamber used in the gate etching according to the related method of the Comparative Example 1 is conceptually shown in FIGS. 2A, 2B, and 2C.

In Comparative Example 1 according to the related method, the residual chlorine content after the $Cl_2/HBr/O_2$ dummy run is higher than that after the over-etching of the first wafer, or that before the BARC etching of the second wafer. Thus, excessive chlorine radicals scavenge oxygen radicals during the BARC etching of the first wafer. Hence the lateral etching rate of BARC etching decreases and the pattern size increases.

The residual chlorine content decreases during the BARC etching but increases during the polysilicon etching and again decreases during the over-etching. Accordingly, the residual chlorine content after the over-etching of the first wafer, or before the BARC etching of the second wafer, is somewhat smaller than that after the dummy run.

Note that both of the BARC etching gas atmosphere and the polysilicon etching gas atmosphere comprise $Cl_2$ and $O_2$. However, the ratio of $Cl_2$ to $O_2$ is low in the BARC etching atmosphere. Therefore, the residual chlorine content decreases during the BARC etching. On the other hand, the ratio of $Cl_2$ to $O_2$ is high in the polysilicon etching atmosphere. Therefore, the residual chlorine content increases during the polysilicon etching.

In fact, the plasma for etching BARC does not significantly etch the polysilicon layer. That is, the etching rate of polysilicon by the BARC etching plasma is about 1/100 or less than that of BARC layer. This fact indicates that oxidation of the surface of polysilicon layer by oxygen radicals proceeds faster than the reaction of the surface with chlorine radicals.

The residual chlorine content similarly decreases, increases, and decreases again during the etching of the second wafer. The residual chlorine content becomes somewhat lower after the over-etching of the second wafer than that after the over-etching of the first wafer. The residual chlorine content becomes further lowered after the over-etching of the third wafer.

After the etching of the fourth wafer, the residual chlorine content after the over-etching, or before the BARC etching of the next wafer, becomes substantially constant. That is, the residual chlorine content after the fourth and subsequent wafers is substantially the same as that before the BARC etching of the next wafer.

According to an embodiment of this invention, conditioning using plasma containing oxygen is performed after the dummy run to reduce the amount of chlorine compounds, functioning as oxygen radical scavenging species. Thus, according to the embodiment of this invention, the effective amount of chlorine compounds after the conditioning is adjusted to approximately the same as that after the over-etching of a sufficient number of wafers (e.g., 5 wafers). Thereby the change in the pattern size is suppressed.

In Example 1 according to an exemplary embodiment of this invention, Step 2*, which is a conditioning step is provided, e.g., between Steps 2 and 3 in Comparative Example 1, to reduce the effective amount of the chlorine compounds functioning as oxygen radical scavenging species in the etching chamber.

Step 2*:
Conditioning is performed under the following conditions using a dummy wafer:
microwave power=1,000 W;
bias power=20 W;
$O_2$/Ar flow rates=30/70 sccm;
pressure=1.0 Pa; and
time=0.5 minutes.

Figure 3A:
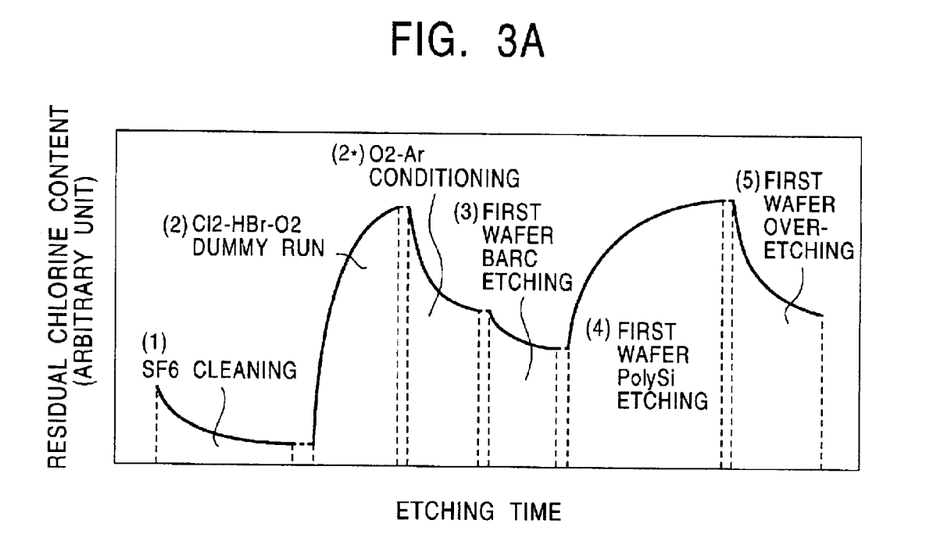
FIGS. 3A and 3B are graphs showing changes in residual chlorine content in an etching chamber during successive processing of a plurality of wafers according to an embodiment of this invention.
Figure 3B:
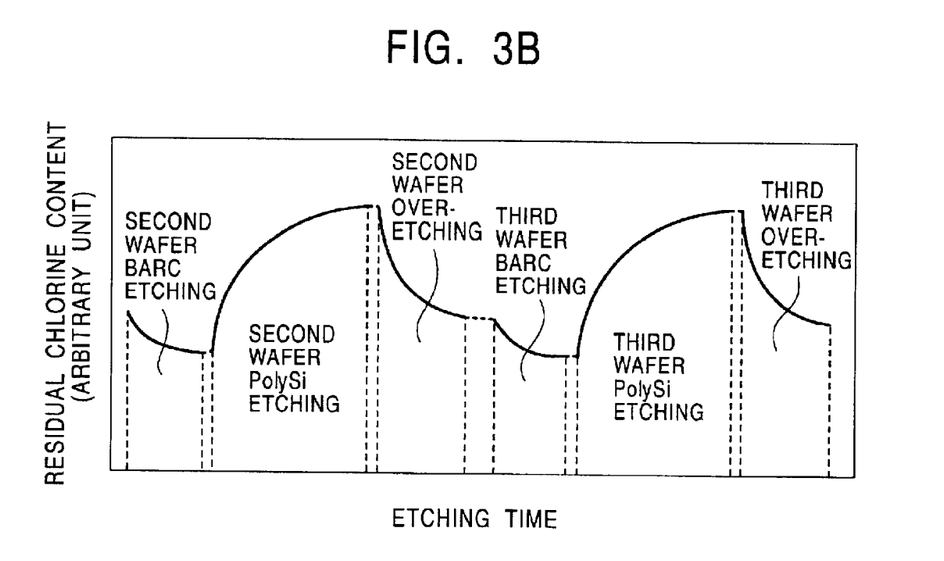

The change of the residual chlorine content in the etching chamber used in the gate etching according to the method of this invention is conceptually shown in FIGS. 3A and 3B.

As shown in FIGS. 3A and 3B, according to the method of this invention, Step 2* functions as a conditioning step to reduce the residual chlorine content. Specifically, the residual chlorine content after the conditioning is reduced to a value that is substantially the same as that after the over-etching of the first, or before the BARC etching of subsequent wafers.

When comparing Comparative Example 1 shown in FIGS. 2A–2C with Example 1 shown in FIGS. 3A–3B, the following phenomena is proven. That is, in Comparative Example 1, the residual chlorine content before the BARC etching decreases according to the number of wafers and reaches a constant value at the fourth or fifth wafer. However, in Example 1, the residual chlorine content before the BARC etching is approximately constant for the first and subsequent wafers.

The residual chlorine content in the etching chamber 11 is defined as the content of chlorine which is released from chlorine compounds such as $SiCl_x$ adhering to the inner wall of the etching chamber 11. That is, the residual chlorine content in an indication of the effective amount of the oxygen radical scavenging species in the etching chamber 11. In other words, the effective amount of the oxygen radical scavenging species in the etching chamber can be indirectly measured by measuring the residual chlorine content in the etching chamber.

The residual chlorine content may be evaluated by measuring an apparent absorption coefficient of infrared light by chlorine compounds. The residual chlorine content may also be evaluated by measuring a peak intensity of $Cl^+$ or $Cl_2^+$ ions by ion mass spectroscopy.

In the former case, the intensity I of infrared light passing through the etching chamber 11 is expressed as: $I=I_0 \cdot exp(-\alpha x)$, where $I_0$ represents an initial light intensity, $\alpha$ represents the apparent absorption coefficient, and x represents the thickness of the material. In this case, x is assumed to be constant and equal to the thickness of the etching chamber 11. When the chlorine content in the etching chamber 11 increases, the apparent absorption coefficient increases.

Actually, the chlorine radical concentration in the plasma for etching BARC layer determines the pattern shift. However, it is difficult to measure the chlorine radical concentration in the BARC etching plasma. Therefore, the chlorine content may be measured at a predetermined pressure by supplying an inert gas at a predetermined flow rate into the etching chamber 11 as an indication of the chlorine radical concentration in the BARC etching plasma.

Figure 4:
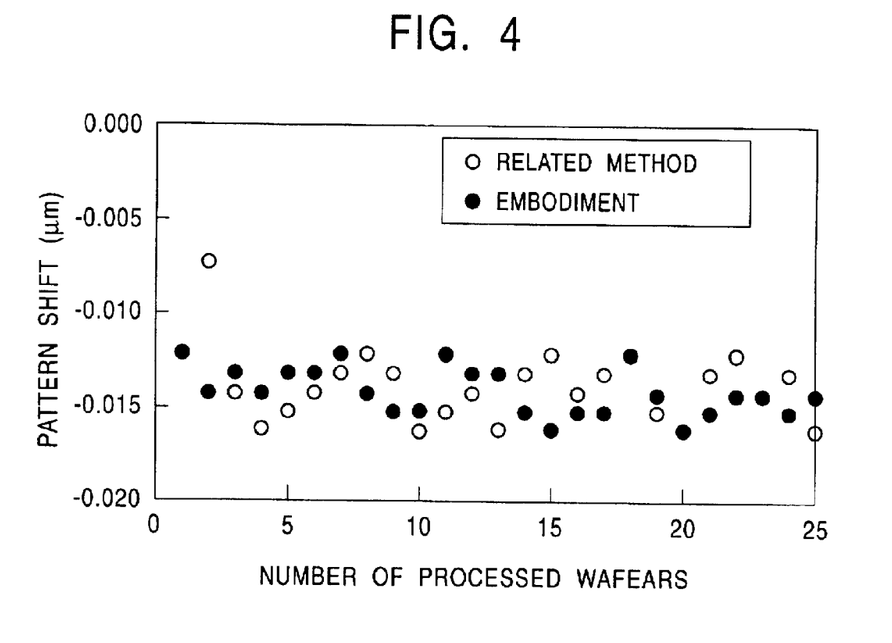
FIG. 4 is a graph showing changes in pattern shifts during successive processing of a plurality of wafers according to an embodiment of this invention and a related method.

FIG. 4 shows a change of pattern shifts in Example 1 and Comparative Example 1.

As shown with open circles in FIG. 4, in Comparative Example 1, the pattern shift of the first wafer is substantially smaller than those of other wafers. That is the pattern shift of the first wafer is about −0.07 μm, and is about 0.07 μm smaller than the average pattern shift of the other wafers.

On the other hand, as shown with closed circles in FIG. 4, the pattern shift of Example 1 is approximately constant from the first wafer. In other words, the variation of the pattern shift of Example 1 is substantially decreased compared to the case of Comparative Example 1. Accordingly, the method of Example 1 is effective in solving the first problem, or the short-term variation of pattern size.

Specifically, the pattern shifts of all of the successively processed 25 wafers are tightly distributed within a range of −0.014 μm±0.002 μm. Therefore, the variation of the pattern shift of Example 1 is reduced to less than about ½, or, more specifically, less than about ⅓, of the variation of Comparative Example 1.

In practice, the condition of the conditioning treatment may be adjusted or selected by measuring the change in the pattern shift in successively processed wafers. That is, a series of experiments to measure the changes in the pattern shift such as shown in FIG. 4 are made with varying conditions. The condition that results a sufficiently small change, or a change within an acceptable range, may be selected as a standard condition.

Therefore, it is not necessary to measure the residual chlorine content or the effective amount of oxygen radical scavenging species in the etching chamber 11 to determine the standard condition. However, the standard condition may not always ensure the acceptable result. Therefore, it is preferable to measure the effective amount of oxygen radical scavenging species or the residual chlorine content and adjust the conditioning step according to the result of the measurement.

In Example 1, the conditioning plasma treatment is performed for a predetermined time, and then the first wafer is processed. It is also possible to measure the effective amount of oxygen radical scavenging species or the residual chlorine content and adjust the condition of the conditioning treatment according to the result of the measurement.

For example, the measurement may be made before processing the first wafer to confirm that the content is substantially equal to a predetermined value or within a predetermined range. If the effective amount of oxygen radical scavenging species or the residual chlorine content is higher than a predetermined value or exceeds a predetermined range, an additional conditioning treatment may be performed.

The predetermined value or range of the residual chlorine content may be determined from measured chlorine contents after the conditioning treatments with varying conditions in the experiments to determine the standard condition of the conditioning treatment. The predetermined value or range may also be determined from measured chlorine content after etching a number of wafers sufficient to reach to a constant value.

Alternatively, the predetermined value or range may be set for the value or range before performing the conditioning. That is, the effective amount of oxygen radical scavenging species or the residual chlorine content in the chamber may be measured after the dummy run and compared with the predetermined value or range. If, for example, the measured value exceeds a standard range, the time of the conditioning may be increased from the standard condition.

It is not necessary to measure the absolute value of the residual chlorine content or the effective amount of oxygen radical scavenging species. It is only necessary to obtain a measured value that is an indication of the content or the effective amount, such as the apparent absorption coefficient of infrared light. The measured value may be compared with the predetermined value or range determined at the same measurement condition.

In Example 1, the conditioning is made with a conditioning gas atmosphere containing $O_2$ and Ar. In this case, $O_2$ gas produces oxygen radicals in the plasma that are effective to reduce the residual chlorine content in the etching chamber. Other oxygen-containing gases, such as CO, may also be used to produce the conditioning gas atmosphere. In this case, CO gas produces CO radicals in the plasma that are effective to reduce the residual chlorine content in the etching chamber. In addition, other inert gases such as He may be used, instead of Ar, as a dilution gas.

The conditioning gas atmosphere may comprise gases other than the oxygen-containing gas and the dilution gas.

As shown in FIGS. 2A–2C and 3A–3B, the residual chlorine content in the chamber is reduced during the BARC etching. Therefore, an atmosphere that is the same as, or similar to, the BARC etching gas atmosphere, may also be used in the conditioning. As explained previously, although the BARC etching gas atmosphere also contains $Cl_2$, the ratio of $Cl_2$ to $O_2$ is small and is effective to reduce the residual chlorine content or the effective amount of oxygen radical scavenging species in the chamber.

The ratio of $Cl_2$ to $O_2$ may be changed as long as an etching rate of silicon is sufficiently small, or the oxidation of the surface of the dummy wafer by oxygen radicals proceeds faster than the reaction of the surface of the dummy wafer with chlorine radicals. If the silicon etching rate is high, or the reaction with chlorine radicals proceeds faster, chlorine compounds such as SiClx are produced by the etching of the surface of the dummy wafer. Preferably, the etching thickness of the surface of the dummy wafer during the conditioning treatment is not larger than about 20 nm, or more preferably not larger than about 10 nm, or further preferably not larger than about 5 nm.

As previously explained, the BARC etching gas atmosphere used in Example 1 has BARC/polysilicon etching rate ratio of about 100 or more. Conditioning gas atmosphere having BARC/polysilicon etching rate ratio of not less than about 20, or more preferable not less than about 35, or further preferably not less than about 50 may be utilized as the conditioning gas atmosphere.

As also shown in FIGS. 2A–2C and 3A–3B, the residual chlorine content in the chamber is reduced during the eover-etching using $HBr/O_2$ atmosphere. Therefore the residual chlorine content may be reduced by a plasma treatment using an atmosphere same as, or similar to, the over-etching gas atmosphere. However, bromine compounds, that may also act as oxygen radical scavenging species deposit in the etching chamber during the plasma treatment using the over-etching gas atmosphere. Therefore, the atmosphere same as, or similar to, the over-etching gas atmosphere is not suitable as the conditioning gas atmosphere.

In Example 1, the condition gas atmosphere is different from the BARC etching gas atmosphere and is also different from the over-etching gas atmosphere. Specifically, the conditioning gas atmosphere does not include $Cl_2$ or other chlorine-containing gas, and does not include HBr or other bromine-containing gas. By using a halogen-free conditioning gas atmosphere, and specifically, a conditioning gas atmosphere only including $O_2$ or other oxygen containing gas, with or without a dilution gas, the amount of oxygen radical scavenging species in the chamber can be sufficiently reduced with a short treatment time.

In Example 1, a dummy run gas atmosphere same as the main etching gas atmosphere is used. That is, the dummy run gas atmosphere contains the same gasses with the same ratio as the main etching gas atmosphere. However, various gas atmospheres similar to the main etching gas atmosphere may be used as the dummy run gas atmosphere. For example, the ratio of the gasses may be modified as along as the ratio of $Cl_2$ to $O_2$ is high enough to increase the effective amount of the oxygen radical scavenging species in the etching chamber increases. Further, it is not necessary that the dummy run gas atmosphere contains all the gassed contained in the main etching gas atmosphere. For example, a gas atmosphere containing only $Cl_2$ and $O_2$ may be used as the dummy run gas atmosphere.

In the above embodiment, the solution of the first problem is described. Next, the solution of the second problem will now be described.

The second problem relates to a long-term change of the pattern size. That is, the pattern size becomes large according to the number of wafers processed successively. As a result of various experiments and studies, this inventor found that the cause of the problem is an improper selection of the wavelength used for detecting the end point of the BARC etching.

In many cases, the wavelength used for detecting the end point of the BARC etching is the same as that used for detecting the end point of polysilicon etching.

First, because the intensity of the optical emission from CO molecules produced in the etching reaction (C+O→CO) of BARC is strong, emission intensities at wavelengths assigned to Si compounds also decrease when the etching of BARC is completed. Second, although optical emission from CO molecules having peak wavelengths of, for example, 278.5 nm and 389.2 nm, can be used for detecting the end point, these emissions are close to emissions from Si compounds having peak wavelengths of 278.1 nm and 390.2 nm. And third, by using the same optical detector both for detecting endpoints of BARC and polysilicon, construction of the etching apparatus can be simplified.

However, when the same wavelength is used for detecting endpoints of BARC and polysilicon etchings, there is a problem in that a pseudo-end point, which is different from the real end point, may be detected. This problem will now be described.

Figure 5:
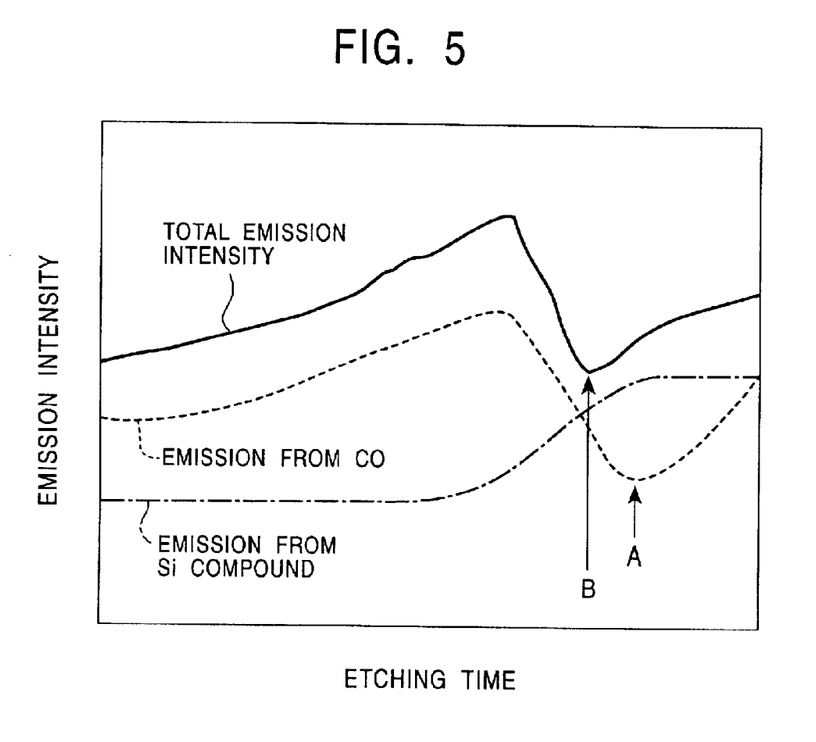
FIG. 5 is a graph showing changes in emission intensity during etching.

FIG. 5 is a graph showing a change in the emission intensity during the BARC etching. The emission intensity at 405.0 nm, which is assigned to a Si compound, is observed. This graph shows that a pseudo-end point appears before the real end point.

As shown in FIG. 5, the emission intensity from CO increases over time during the etching of BARC, because CO is formed by etching of BARC layer and the etching rate increases due to the reaction heat. Then, the emission intensity from CO begins to decrease when the etching of BARC layer is completed and the underlying layer gradually appears at selected portions on the wafer. The emission from CO reaches a minimum at point A, which is the real endpoint, when the unmasked portions of the BARC layer is completely etched at entire portions on the wafer. Then, the intensity increases again with the progress of the oxidation of the resist mask.

In contrast, the emission intensity from reaction products (e.g., Si compounds) of the polysilicon layer under the BARC layer increases after the polysilicon layer appears. The emission intensity reaches the maximum and saturates when the BARC layer is completely etched.

The total emission intensity, which is a sum of the emission intensities from CO and Si compounds, reaches the minimum (i.e., the pseudo end point) at point B before the real end point at A as shown in FIG. 5.

Further, Si compounds produced by etching of polysilicon deposit on the inner wall of the etching chamber and accumulate during the successive processing of a plurality of wafers. The accumulated Si compounds react with chlorine radicals to form $SiCl_4$, which is released in the plasma. Optical emission from the released $SiCl_4$ shifts the baseline of the emission from Si compounds upwardly. As a result, the pseudo-end point appears earlier in the etching time.

Thus, if the endpoint is determined at the pseudo end point and the over-etching time is determined to be a fixed percentage of the time to the pseudo end point, the actual over-etching amount to the BARC layer decreases in accordance with the number of processed wafers. Therefore, pattern width increases in accordance with the number processed wafers. In the worst case, an incomplete etching of the BARC layer may occur.

In order to solve these problems, the end point is determined by monitoring an optical emission from CO separate from emissions from Si compounds. Specifically, an emission from CO having a peak wavelength wherein no emission peak assigned to Si compounds present within the range of ±1.5 nm are selected. By using a monochrometer or a filter, such emission from CO can be monitored without being disturbed by emissions from Si compounds. For example, emissions having peak wavelengths of 349.3, 519.8, and 608.0 nm are chosen.

Further, the endpoint may be determined by detecting a convergent point (for example, SLOPE END). That is, the point A at the end of the slope of decreasing emission intensity is detected.

Example 2 according to an exemplary embodiment of this invention and Comparative Examples 2 according to a related method will now be described.

B. EXAMPLE 2 AND COMPARATIVE EXAMPLE 2

In Example 2 and Comparative Example 2, the same substrates are etched using the same etching apparatus as in Example 1 and Comparative Example 1. In each of the Example 2 and Comparative Example 2, 5,000 wafers are successively processed. Plasma cleaning is performed after 25 wafers are processed.

In order to determine the end point of BARC etching, optical emission at and around 519.8 nm, which is a peak wavelength of emission assigned to CO, is monitored in Example 2. A filter is used to monitor the emission with the peak wavelength of 519.8 nm from CO separately from emissions at other wavelength. Because there is no emission assigned to Si compounds having peak wavelength within 1.5 nm from the monitored wavelength, a conventional filter can be used to monitor the emission from CO with the peak wavelength of 519.8 nm separately from emissions at other wavelengths. Thereby, the real endpoint A can be detected without being disturbed by emissions from Si compounds.

In practice, only the emissions from Si compounds that are produced in the BARC etching plasma may disturb the end point detection. That is, it is acceptable that a certain Si compound that is not produced in the plasma has a peak emission wavelength within 1.5 nm from the monitored wavelength.

On the other hand, in Comparative Example 2, emission at or around 405.0 nm, which is a peak wavelength of emission assigned to Si compound, is monitored. Therefore, the pseudo endpoint is detected, instead of the real endpoint. In both of the Example 2 and Comparative Example 2, the BARC layer is over-etched after the detection of the endpoint. The over-etching time is calculated as a fixed percentage of the time to the endpoint.

Figure 6:
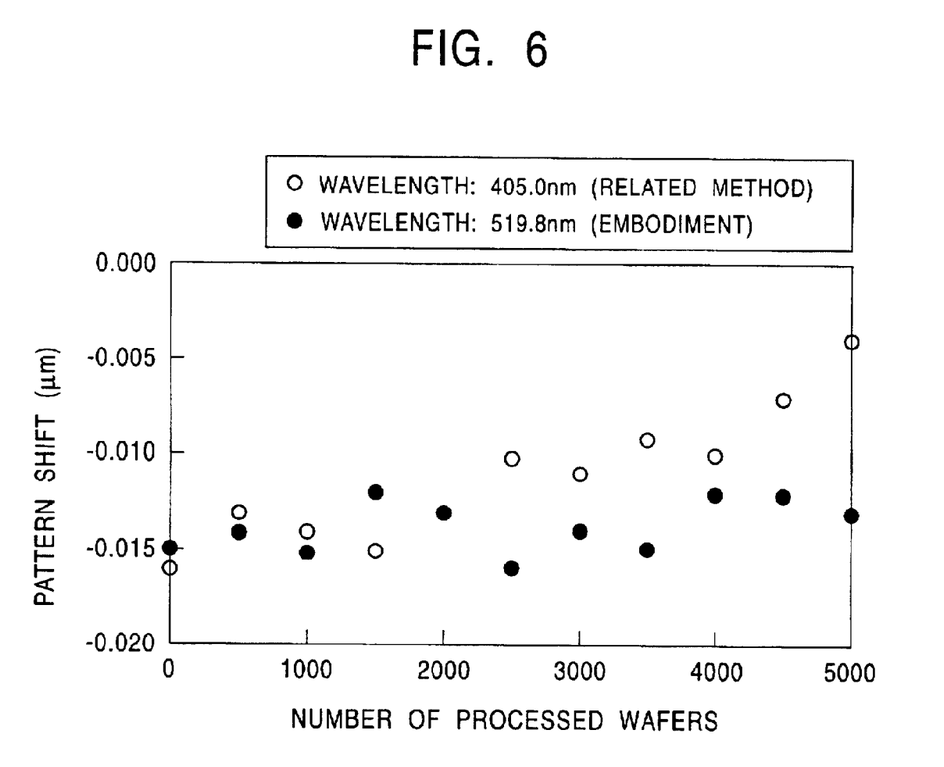
FIG. 6 is a graph showing changes in pattern shifts during successive processing of a plurality of wafers according to an embodiment of this invention and a related method.

FIG. 6 shows the change of the pattern shift. In Comparative Example 2, the pattern shift increases in accordance with the number of processed wafers. In Comparative Example 2, the pseudo end point appears earlier. In addition, the difference between the pseudo endpoint and the real endpoint increases in accordance with the number of processed wafers due to the accumulation of Si compounds on the inner wall of the etching chamber. Although plasma cleaning is performed after 25 wafers are processed, the plasma cleaning cannot completely remove the Si compounds from some portions on the inner wall of the etching chamber. Therefore, the accumulation of Si compounds increases in accordance with the number of processed wafers. As a result, the actual over-etching time decreases and the pattern size increases in accordance with the number of processed wafers, as shown with open circles in FIG. 6.

In contrast, change in the pattern shift is small, as shown in Example 2 with closed circles in FIG. 6.

Accordingly, change in the pattern shift due to successive processing of a large number of wafers is reduced by monitoring optical emission from CO as described in Example 2 according to an embodiment of this invention.

Among the causes of increasing the emission intensity from Si compounds, emission from a base layer (polysilicon layer) after the completion of BARC layer etching may be suppressed by selecting a BARC etching condition having a high selectivity to the polysilicon layer. Therefore, the increase of the emission intensity from Si compounds is mainly caused by the accumulation of etched Si products on the inner wall of the etching chamber 11.

The main reaction of the BARC etching is C+O→CO. Therefore, the emission from CO is monitored for detecting the end point in Example 2. However, emissions from other species such as $CO_2$ may also be monitored for detecting the end point.

In the exemplary embodiments explained above, the BARC layer and the polysilicon layer are etched continuously in the same etching chamber. The $Cl_2/HBr/O_2/Ar$ etching gas atmosphere is used for etching the BARC layer. The $Cl_2/HBr/O_2$ etching gas atmosphere is used for etching the bulk of the polysilicon layer, and the $HBr/O_2$ etching gas atmosphere is used for over-etching the polysilicon layer.

This invention can also be used for etching processes using different etching gas atmospheres. The BARC layer may be etched using $Cl_2/O_2/Ar$, $Cl_2/O_2$, $HBr/O_2$, or other etching gas atmospheres containing oxygen as a form of $O_2$ or other oxygen-containing gas as a main component to produce a sufficient amount of oxygen radicals. The oxygen radicals are main etchant species to etch the BARC layer.

The polysilicon layer may also be etched using $Cl_2/O_2$ or other etching gas atmospheres containing chlorine as a form of $Cl_2$ or other chlorine-containing gas as a main component to produce a sufficient amount of chlorine radicals. Chlorine radicals are main etchant species to etch the polysilicon layer.

This invention can also be effectively used for patterning various films comprising layers of various materials. Various organic material layers other than BARC can be etched using etching gas atmosphere containing oxygen.

Specifically, this invention can be used for forming fine gate electrode patterns with various conductive materials using a BARC layer. Metal silicides layers such as tungsten silicide or other refractory metal silicide layers, metal layers, such as tungsten or other refractory metal layers, or other conductive material layers may be etched using etching gas atmospheres containing chlorine. Further, multi-layered films comprising a plurality of conductive material layers stacked with the BARC layer may be patterned.

Etching gas atmospheres containing chlorine may also be used for etching silicide, metal, or other conductive material layers. The same problem of pattern size variation due to the change of amount of oxygen radical scavenging species may occur in the etching of these films using the BARC layer. Thus, the etching method according to this invention may advantageously utilized.

In the exemplary embodiments explained above, the etching chamber is plasma cleaned using $SF_6$ gas, the dummy run is made using the $Cl_2/HBr/O_2$ etching gas atmosphere, and the conditioning is made using the $O_2/Ar$ gas atmosphere. After the conditioning, a plurality of wafers having polysilicon layers to be etched on the surface of the substrate are successively introduced into the conditioned etching chamber and processed.

Usually, a gas atmosphere that is the same as, or similar to, that used to etch the bulk of the conductive material layer to be processed, such as polysilicon, silicide, or metal layer, is used for the dummy run. As has been explained, the etching gas atmosphere for etching the bulk of the conductive material layer may contains $Cl_2$ as a main etchant gas that produces a sufficient amount of chlorine radicals to etch polysilicon or other conductive materials. Therefore, the dummy run gas atmosphere may also contain $Cl_2$, and a large amount of chlorine radicals are produced during the dummy run. As a result, the amount of chlorine compound, which acts as oxygen radical scavenging species, in the etching chamber is increased. Thus, the conditioning is made to reduce the effective amount of oxygen plasma scavenging species in the etching chamber in order to suppress the variation of the pattern size.

Other species such as bromine compounds may also act as oxygen radical scavenging species. Therefore, this invention may also be advantageously used for conditioning an etching chamber in which a dummy run is conducted using a gas atmosphere containing at least one of chlorine and bromine.

In the exemplary embodiments explained above, the polysilicon layer formed on the surface of the semiconductor substrate via the gate dielectric film are etched in the conditioned etching chamber. This invention may also advantageously applied to a trench etching, i.e., etching of a surface layer of a semiconductor substrate (e.g., a silicon wafer). In this case, a surface layer of the semiconductor substrate itself is the material layer to be etched on the surface of the semiconductor substrate. Etching gas atmosphere such as $Cl_2/HBr/O_2$ or $HBr/O_2$ may be used as a main etching gas to etch the surface layer of the silicon wafer.

In practice, for example, a silicon dioxide, a silicon nitride, and a BARC layer are formed on a surface of a semiconductor substrate in this order, and a resist mask pattern is formed on the BARC layer. The BARC layer is etched using an oxygen-based etching gas atmosphere. The silicon nitride and silicon dioxide layers are etched using a fluorine-based etching gas atmosphere. Then the surface silicon layer is etched using, for example, $HBr/O_2$ etching gas atmosphere. The etching of the BARC, silicon nitride, silicon dioxide, and the silicon layers may be performed continuously in a same etching chamber.

The etching chamber may be cleaned using a fluorine-based cleaning gas atmosphere after processing, for example, a certain number of wafers. The dummy run is made using, for example, $Cl_2/HBr/O_2$ or $HBr/O_2$ dummy run gas atmosphere. After the dummy run, the conditioning may be made using a conditioning gas atmosphere containing oxygen to adjust the effective amount of oxygen radical scavenging species, e.g., an effective amount of bromine and/or chlorine compounds, in the etching chamber.

The conditioning gas atmosphere contains oxygen as a form of $O_2$ or other oxygen-containing gas as a main component to produce sufficient amount of oxygen radicals or other radicals having high oxidizing ability. The oxygen radicals or other oxidizing radicals reduce the effective amount of oxygen radical scavenging species in the etching chamber. When CO gas is used as the oxygen-containing gas, CO radicals are the main oxidizing spices effective to reduce the effective amount of oxygen radical scavenging species. Various atmospheres containing oxygen may be used as the conditioning gas atmosphere.

As previously explained, the conditioning gas atmosphere may also contain $Cl_2$ or other chlorine-containing gas. However, in order to effectively reduce the effective amount of oxygen radical scavenging species, the ratio of $Cl_2$ or other chlorine-containing gas to $O_2$ or other oxygen-containing gas should be small. Therefore, the surface of the dummy wafer is not significantly etched during the conditioning. Although chlorine radicals are also produced by plasma excitation of the conditioning gas atmosphere, oxidation of the surface of the dummy wafer by the oxygen radicals exceeds the etching of the surface of the dummy wafer by the chlorine radicals.

In the exemplary embodiments explained above, the dummy run and the conditioning are performed as separate steps. In certain cases, however, it may be possible to adjust the condition of the dummy run so that the effective amount of oxygen plasma scavenging species in the etching chamber does not increase too much. Thereby, the effective amount of oxygen radical scavenging species in the etching chamber may be adjusted to be substantially equal to the effective amount after the over-etching without the conditioning treatment. In other words, the dummy run and the conditioning may be performed simultaneously in the same step.

In practice, however, the dummy run condition should be selected so that the residual fluorine content remained after the plasma cleaning is sufficiently reduced. Therefore, it is often inevitable that the effective amount of oxygen plasma scavenging species increases too much during the dummy run. Therefore, the dummy run and the conditioning are preferably performed as separate steps.

As schematically shown in FIG. 3A, the cleaning, the dummy run, the conditioning, and the processing of the first wafer are performed continuously with some intervals between them (shown by broken lines FIG. 3A). That is, the conditioning is performed just before starting processing, or etching of the BARC layer, of the first wafer. Of course, there may be a time interval between the conditioning and the processing necessary for changing the wafer, changing the gas atmosphere, and so on. Other procedures that do not materially alter the condition of the inner wall of the etching chamber may be made during these steps. For example, measurement of the effective amount of oxygen radical scavenging species may be made between the conditioning and the processing of the first wafer. Even in such cases, the conditioning is performed just before starting the processing of the first wafer.

However, it is not preferable to perform a procedure that materially changes the condition of the inner wall of the etching chamber between the conditioning and the processing of the first wafer. For example, a plasma treatment using a gas atmosphere containing halogen materially changes the condition of the inner wall of the etching chamber, or the effective amount of oxygen radical scavenging species in the chamber.

The primary purpose of the conditioning treatment is to adjust the effective amount of oxygen plasma scavenging species in the etching chamber when the processing of the first wafer starts. Therefore, a procedure that materially changes the effective amount of oxygen plasma scavenging species that nullifies the adjustment by the conditioning should not be made between the conditioning and the processing of the first wafer. In other words, a procedure that changes effective amount of oxygen plasma scavenging species in the chamber may be made after the conditioning as long as the change is small or predictable to permit the adjustment by the conditioning.

The wafer holder 20 may hold the wafer by means of an electrostatic chuck. To remove the wafer from the chuck, plasma generated in an Ar gas atmosphere may be used to discharge the electrostatic charge. In this case, for example, the conditioning treatment includes two steps of plasma treatments, i.e., a treatment with the plasma using the conditioning gas atmosphere, and a treatment with the Ar plasma. The effective amount of the oxygen radical species in the etching chaamber is adjusted by the treatment with the conditioning gas atmosphere and the treatment with the Ar plasma does not materially change the effective amount.

Similarly, the over-etching may include two steps of plasma treatments, i.e., a treatment with plasma using the over-etching gas atmosphere, and a treatment with the Ar plasma. The treatment with the Ar plasma does not materially change the effective amount of oxygen radical scavenging species in the etching chamber.

As shown in FIGS. 2A to 2C, the residual chlorine content is stabilized after processing four or five wafers. Therefore, by processing a few or several dummy wafers before processing actual product wafers, the variation of the pattern size can be suppressed without performing the conditioning treatment. In this case, however, a significant time is needed to process the dummy wafers. In addition, because the accumulation of etched products also occurs during the processing of dummy wafers, the number of product wafers that can be processed during plasma cleanings are reduced. Therefore, production efficiency is reduced.

According to this invention, the variation of pattern size can be suppress by the conditioning treatment without materially reducing the productivity.

In the above exemplary embodiments, methods for conditioning an etching chamber and methods of processing semiconductor substrate are described in detail. While the invention has been described with reference to exemplary embodiments thereof, it is to be understood that the invention is not limited to the exemplary embodiments or constructions. To the contrary, the invention is intended to cover various modifications and equivalent arrangements.

What is claimed is:

1. A method of conditioning an etching chamber for processing a semiconductor substrate, the substrate comprising a conductive material layer on a surface thereof, an organic material layer stacked over the conductive material layer, and a mask pattern formed over the organic material layer, the processing comprising:
    etching the organic material layer using a first etching gas atmosphere containing oxygen;
    etching the conductive material layer using a second etching gas atmosphere; and
    over-etching the conductive material layer using a third etching gas atmosphere containing oxygen; and
the method of conditioning, before processing the semiconductor substrate, comprising:
    conducting a dummy run in the etching chamber using a dummy run gas atmosphere containing at least one of chlorine and bromine; and
    conditioning the etching chamber after conducting the dummy run using a conditioning gas atmosphere containing oxygen, wherein the conditioning gas atmosphere is different from the third etching gas atmosphere.

2. The method according to claim 1, wherein the method of conditioning further comprises:
cleaning the etching chamber, before conducting the dummy run, using a cleaning gas atmosphere containing fluorine.

3. The method according to claim 1, wherein the third etching gas atmosphere also contains halogen and the conditioning gas atmosphere is halogen-free.

4. The method according to claim 1, wherein the conductive material layer contains silicon.

5. The method according to claim 1, wherein the conductive material layer is a polysilicon layer.

6. The method according to claim 1, wherein the conditioning is peformed just before starting the etching of the organic material layer.

7. The method according to claim 6, wherein;
the conditioning is performed using a bare silicon wafer as a dummy wafer; and
the conditioning comprises generating plasma in the etching chamber using the conditioning gas atmosphere such that the plasma has an etching rate of the organic material layer which is at least about 20 times higher than an etching rate of a polysilicon layer.

8. A method of conditioning an etching chamber for processing a semiconductor substrate, the substrate comprising a conductive material layer on a surface thereof, an organic material layer stacked over the conductive material layer, and a mask pattern formed over the organic material layer,
the processing comprising:
etching the organic material layer using a first etching gas atmosphere containing oxygen;
etching the conductive material layer using a second etching gas atmosphere;
over-etching the conductive material layer using a third etching gas atmosphere containing oxygen; and
the method of conditioning, before processing the semiconductor substrate, comprising:
conducting a dummy run in the etching chamber using a dummy run gas atmosphere to increase an effective amount of oxygen radical scavenging species in the etching chamber; and
conditioning the etching chamber after conducting the dummy run using a conditioning gas atmosphere to adjust the effective amount of oxygen radical scavenging species in the etching chamber within a predetermined range, wherein the conditioning gas atmosphere is different from the third etching gas atmosphere.

9. The method according to claim 8, wherein the method of conditioning reduces the effective amount of oxygen radical scavenging species in the etching chamber.

10. The method according to claim 8, wherein
the conditioning is conducted such that the effective amount of oxygen radical scavenging species in the etching chamber just before starting the etching the organic material layer is substantially equal to that after the over-etching.

11. The method according to claim 8, wherein the method of conditioning further comprises:
measuring the effective amount of oxygen plasma scavenging species in the etching chamber; and
the conditioning adjust the effective amount of the oxygen radical scavenging species according to a result of the measuring.

12. The method according to claim 8, wherein the conductive material layer contains silicon.

13. The method according to claim 8, wherein the conductive material layer is a polysilicon layer.

14. A method of processing a plurality of semiconductor substrates for forming semiconductor devices, the method comprising:
a. introducing one of the plurality of semiconductor substrates in an etching chamber, each of the substrates comprising a conductive material layer on a surface thereof, an organic material layer stacked over the conductive material layer, and a mask pattern formed over the organic material layer;
b. etching the organic material layer using a first etching gas atmosphere containing oxygen;
c. etching the conductive material layer, using a second etching gas atmosphere;
d. over-etching the conductive material layer using a third etching gas atmosphere containing oxygen; and
e. repeating steps a through d until all of the plurality of semiconductor substrates are processed;
wherein the method of processing further comprises a method of conditioning, before processing the plurality of semiconductor substrates, comprising:
conducting a dummy run in the etching chamber using a dummy run gas atmosphere containing at least one of chlorine and bromine; and
conditioning the etching chamber after conducting the dummy run using a conditioning gas atmosphere containing oxygen, wherein the conditioning gas atmosphere is different from the third etching gas atmosphere.

15. The method according to claim 14, wherein the method of conditioning further comprises:
cleaning the etching chamber, before conducting the dummy run, using a cleaning gas atmosphere containing fluorine.

16. The method according to claim 14, wherein the conductive material layer contains silicon.

17. The method according to claim 14, wherein the conductive material layer is a polysilicon layer.

18. The method according to claim 14, wherein the conditioning is performed just before starting the etching of the organic material layer of a first one of the plurality of semiconductor substrates.

19. The method according to claim 18, wherein;
the conditioning is performed using a bare silicon wafer as a dummy wafer; and
the conditioning comprises generating plasma in the etching chamber using the conditioning gas atmosphere such that the plasma has an etching rate of the organic material layer which is at least about 20 times higher than an etching rate of a polysilicon layer.

20. A method of processing a plurality of semiconductor substrates for forming semiconductor devices, the method comprising:
a. introducing one of the plurality of semiconductor substrates in an etching chamber, each of the substrates comprising a conductive material layer on a surface thereof, an organic material layer stacked over the conductive material layer, and a mask pattern formed over the organic material layer;
b. etching the organic material layer using a first etching gas atmosphere containing oxygen;
c. etching the conductive material layer using a second etching gas atmosphere; and
d. repeating steps a through c until all of the plurality of semiconductor substrates are processed;

wherein the method of processing further comprises a method of conditioning after a dummy run and before processing the plurality of semiconductor substrates, comprising:

conditioning the etching chamber such that an effective amount of oxygen radical scavenging species in the etching chamber just before starting the etching of the organic material layer of a first one of the plurality of semiconductor substrates is substantially equal to that just before starting the etching of the organic material layer of a second one of the plurality of semiconductor substrates and wherein the dummy run is performed using a dummy run gas atmosphere, and the conditioning is performed using a conditioning gas atmosphere different from the dummy run gas atmosphere.

21. The method according to claim 20, wherein the conductive material layer contains silicon.

22. The method according to claim 20, wherein the conductive material layer is a polysilicon layer.

23. The method according to claim 20, wherein the conditioning decreases the effective amount of oxygen radical scavenging species in the etching chamber.

24. The method according to claim 23, wherein the conditioning gas atmosphere contains oxygen.

25. The method according to claim 20, wherein
the dummy run increases the effective amount of oxygen radical scavenging species in the etching chamber.

26. The method according to claim 25, wherein the dummy run gas atmosphere contains at least one of chlorine and bromine.

27. A method of processing a plurality of semiconductor substrates for forming semiconductor devices, the method comprising:

a. introducing one of the plurality of semiconductor substrates in an etching chamber, each of the substrates comprising a conductive material layer on a surface thereof, an organic material layer stacked over the conductive material layer, and a mask pattern formed over the organic material layer, the mask pattern having a mask size;

b. forming a pattern of the organic material layer using a first etching gas atmosphere;

c. forming a pattern of the conductive material layer, the pattern of the conductive material layer having a pattern size; and d. repeating steps a through c until all of the plurality of semiconductor substrates are processed;

wherein the method of processing further comprises a method of conditioning, before processing the plurality of semiconductor substrates, comprising:

conducting a dummy run in the etching chamber using a dummy run gas atmosphere containing at least one of chlorine and bromine; and conditioning the etching chamber after conducting the dummy run using a conditioning gas atmosphere, wherein:

each of the plurality of semiconductor substrate has a pattern shift between the mask size and the pattern size; and the conditioning is performed such that a variation of the pattern shift in the plurality of semiconductor substrates is substantially decreased compared to a case that the conditioning is not performed.

28. The method according to claim 27, wherein the pattern shift is decreased to less than about ½ compared to the case that the conditioning is not performed.

29. The method according to claim 27, wherein:

the first etching gas atmosphere contains oxygen;

the dummy run increases an effective amount of oxygen radical scavenging species in the etching chamber; and the conditioning adjusts the effective amount of oxygen radical scavenging species in the etching chamber within a predetermined range.

30. The method according to claim 27, wherein:

the first etching gas atmosphere contains oxygen;

the method of conditioning further comprises measuring an effective amount of oxygen radical scavenging species in the etching chamber, and the conditioning is performed according to a result of the measuring.

31. The method according to claim 27, wherein said forming the pattern of the conductive material layer includes a main etching using the second etching gas atmosphere and an over-etching using a third etching gas atmosphere.

32. The method according to claim 27, wherein:

the first etching gas atmosphere contains oxygen; and the conditioning comprises generating plasma using the conditioning gas atmosphere containing oxygen.

33. The method according to claim 27, wherein the conductive material layer contains silicon.

34. The method according to claim 27, wherein the conductive material layer is a polysilicon layer.

35. A method of processing a semiconductor substrate for forming a semiconductor device, comprising:

introducing a semiconductor substrate into an etching chamber, the semiconductor substrate comprising a conducting material layer containing silicon on a surface thereof and an organic material layer stacked on the conductive material layer; and etching the organic material layer by generating plasma in the etching chamber using an etching gas atmosphere containing oxygen, the etching including detecting an end-point by monitoring an optical emission from CO molecules having a first peak wavelength where the CO molecules and silicon compounds are present in the plasma, and no peak wavelengths of optical emissions from the silicon compounds in the plasma are present in a specified range; and etching the conductive material layer after the etching of the organic material layer in the etching chamber.

36. The method according to claim 35, wherein the peak wavelengths of optical emissions from the silicon compounds in the plasma are apart from the first peak wavelength by at least 1.5 nm.

37. The method according to claim 35, wherein the first peak wavelength is one of 349.3 nm, 519.8 nm, 561.0 nm and 608.0 nm.

38. The method according to claim 35, wherein the end-point is detected by monitoring only the optical emission lmving the first peak wavelength.

* * * * *